United States Patent
Loh et al.

(10) Patent No.: US 8,044,418 B2
(45) Date of Patent: Oct. 25, 2011

(54) LEADFRAME-BASED PACKAGES FOR SOLID STATE LIGHT EMITTING DEVICES

(75) Inventors: Ban P. Loh, Durham, NC (US); Nicholas W. Medendorp, Jr., Raleigh, NC (US); Eric Tarsa, Goleta, CA (US); Bernd Keller, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 11/657,347

(22) Filed: Jan. 24, 2007

(65) Prior Publication Data

US 2008/0012036 A1    Jan. 17, 2008

Related U.S. Application Data

(63) Continuation-in-part of application No. 11/486,244, filed on Jul. 13, 2006.

(51) Int. Cl.
*H01L 23/495* (2006.01)

(52) U.S. Cl. ............ 257/98; 257/99; 257/666; 257/676; 257/E23.037

(58) Field of Classification Search .................... 257/98, 257/99, 100, 676, E33.057, E33.072, E33.073, 257/79, 666, 684, 796, 675, 712, 713, 717, 257/720

See application file for complete search history.

(56) References Cited

U.S. PATENT DOCUMENTS

| | | | |
|---|---|---|---|
| 5,748,658 A * | 5/1998 | Nakanishi et al. | ......... 372/43.01 |
| 6,376,902 B1 | 4/2002 | Arndt | |
| 6,455,356 B1 * | 9/2002 | Glenn et al. | ................. 438/123 |
| 6,469,321 B2 | 10/2002 | Arndt | |
| 6,573,580 B2 | 6/2003 | Arndt | |
| 6,680,491 B2 | 1/2004 | Nakanishi et al. | |
| 6,716,673 B2 | 4/2004 | Watl et al. | |
| 6,747,293 B2 * | 6/2004 | Nitta et al. | ...................... 257/99 |
| 7,034,382 B2 * | 4/2006 | Palmteer et al. | .............. 257/676 |
| 7,045,905 B2 | 5/2006 | Nakashima | |
| 7,253,448 B2 | 8/2007 | Roberts et al. | |

(Continued)

FOREIGN PATENT DOCUMENTS

CN    1148637    4/1997

(Continued)

OTHER PUBLICATIONS

SnapLED 150 Technical Data D208, Limileds Lighting, LLC, Oct. 11, 2004, pp. 1-6.

(Continued)

*Primary Examiner* — Evan Pert
*Assistant Examiner* — Selim Ahmed
(74) *Attorney, Agent, or Firm* — Myers Bigel Sibley & Sajovec

(57) ABSTRACT

A modular package for a light emitting device includes a leadframe including a first region having a top surface, a bottom surface and a first thickness and a second region having a top surface, a bottom surface and a second thickness that is less than the first thickness. The leadframe further includes an electrical lead extending laterally away from the second region, and the package further includes a thermoset package body on the leadframe and surrounding the first region. The thermoset package body may be on both the top and bottom surfaces of the second region. A leak barrier may be on the leadframe, and the package body may be on the leak barrier. Methods of forming modular packages including thermoset package bodies on leadframes are also disclosed.

16 Claims, 10 Drawing Sheets

U.S. PATENT DOCUMENTS

| | | | |
|---|---|---|---|
| 7,282,785 B2 | 10/2007 | Yoshida | |
| 7,378,299 B2 * | 5/2008 | Koh et al. | 438/123 |
| 2001/0000622 A1 * | 5/2001 | Reeh et al. | 257/98 |
| 2002/0004251 A1 * | 1/2002 | Roberts et al. | 438/26 |
| 2002/0163001 A1 | 11/2002 | Shaddock | |
| 2004/0041222 A1 * | 3/2004 | Loh | 257/433 |
| 2004/0079957 A1 | 4/2004 | Andrews et al. | |
| 2004/0080026 A1 | 4/2004 | Minamio et al. | |
| 2004/0126913 A1 | 7/2004 | Loh | |
| 2005/0077623 A1 * | 4/2005 | Roberts et al. | 257/724 |
| 2005/0189626 A1 | 9/2005 | Xiaochun et al. | |
| 2005/0218421 A1 | 10/2005 | Andrews et al. | |
| 2005/0218489 A1 | 10/2005 | Satou et al. | |
| 2005/0269587 A1 | 12/2005 | Loh et al. | |
| 2006/0124953 A1 * | 6/2006 | Negley et al. | 257/99 |
| 2006/0223238 A1 | 10/2006 | Koh et al. | |

FOREIGN PATENT DOCUMENTS

| | | |
|---|---|---|
| CN | 1638158 A | 7/2005 |
| CN | 1808713 A | 7/2006 |
| JP | 2000-252323 | 9/2000 |
| JP | 2002252373 | 9/2002 |
| JP | 2005-197369 | 7/2005 |
| JP | 2005353914 | 12/2005 |
| JP | 2006179541 | 7/2006 |

OTHER PUBLICATIONS

Luxeon® Star power light source Technical Datasheet DS23, Lumileds Lighting, LLC, Mar. 2006, pp. 1-18.

SnapLED 150 Technical Data DS08, Lumileds Lighting, LLC, Oct. 11, 2004, pp. 1-6.

Declaration of Gerald Negley under 37 C.F.R. § 1.132, dated Aug. 21, 2009.

Declaration of Charles Swoboda under 37 C.F.R. § 1.132, dated Aug. 21, 2009.

Translation of First Office Action for Chinese Patent Application No. 200810003832.3 dated Sep. 14, 2010.

Translation of First Office Action for corresponding Chinese Application No. 200710142165.2 dated Mar. 24, 2010.

Translation of Second Office Action for Chinese Patent Application No. 200710142165.2 mailed Mar. 4, 2011.

Translation of Official Action for Japanese Patent Application No. 2008-014205 mailed May 24, 2011.

* cited by examiner

LEADFRAME-BASED PACKAGES FOR SOLID STATE LIGHT EMITTING DEVICES

CLAIM OF PRIORITY

The present application is a continuation-in-part of U.S. patent application Ser. No. 11/486,244, filed on Jul. 13, 2006, the disclosure of which is hereby incorporated by reference herein as if set forth in its entirety.

FIELD OF THE INVENTION

This invention relates to solid state light emitting devices, and more particularly to packages for solid state light emitting devices and methods of forming packages for solid state light emitting devices.

BACKGROUND

It is known to mount solid state light sources, such as semiconductor light emitting devices, in packages that may provide protection, color selection, focusing, and the like, for light emitted by the light emitting device. A solid state light emitting device may be, for example, an organic or inorganic light emitting diode ("LED"). Some packages for light emitting diodes are described in U.S. Pre-grant Publication Nos. 2004/0079957, 2004/0126913, and 2005/0269587 which are assigned to the assignee of the present invention, and which are incorporated herein by reference as if set forth fully herein.

Packages as described in the above referenced publications may be suitable for high power, solid state illumination applications. However, notwithstanding the advances described therein, there remains a need for improved packages in which multiple LEDs may be mounted. In particular, in some general lighting applications it may be desirable for an LED package to include multiple LEDs emitting in different regions of the visible spectrum. Light emitted by the LEDs may combine to produce a desired intensity and/or color of light, such as white light or any other desired color. In that case, it may be desirable for the LEDs in the package to be mounted relatively closely together.

A typical leadframe-based LED package includes electrical leads, contacts or traces for electrically connecting the LED package to an external circuit. In a typical LED package 10 illustrated in FIG. 1A, an LED chip 12 is mounted on a reflective cup 13 by means of a solder bond or conductive epoxy. One or more wirebonds 11 connect the ohmic contacts of the LED chip 12 to leads 15A and/or 15B, which may be attached to or integral with the reflective cup 13. The reflective cup 13 may be filled with an encapsulant material 16 containing a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. However, heat retention may be an issue for a package such as the package 10 shown in FIG. 1A, since it may be difficult to extract heat through the leads 15A, 15B, as both leads 15A, 15B cannot be connected to a heatsink, or they will be electrically shorted. Furthermore, both leads 15A, 15B are usually made of thin sheet metal of 0.50 mm maximal thickness, beyond which it is difficult to be manufactured and handled.

A conventional surface-mountable leadframe-based package 20 is illustrated in FIG. 1B. The package 20 includes an LED chip 22 mounted on a reflective cup 23. One or more wirebonds 21 connect the ohmic contacts of the LED chip 22 to leads 25A and/or 25B, which may be attached to or integral with the reflective cup 23. A clear protective resin 24 is cast around the assembly. The reflective cup 23 may be formed by stamping a thin sheet of metal when the leadframe is formed. Stamping the reflective cup 23 may result in thinning of the base and/or sidewalls of the cup 23, thus reducing its thermal spreading properties and capacity to dissipate heat generated by the semiconductor chips mounted at the bottom of the cup. Hence, less heat is extracted out of the package through the leads 25A, 25B, resulting in higher thermal resistance that limits the performance of the device. This type of package usually can handle a maximum power up to only about 0.5 Watt.

SUMMARY

Embodiments of the invention provide a modular package for a light emitting device. The modular package includes a leadframe including a first region having a top surface, a bottom surface and a first thickness and a second region having a top surface, a bottom surface and a second thickness that is less than the first thickness. The leadframe further includes an electrical lead extending laterally away from the second region, and the package further includes a thermoset package body on the leadframe and surrounding the first region. The thermoset package body may be on both the top and bottom surfaces of the second region.

The second region may include a recess in the leadframe, and the thermoset package body may at least partially fill the recess.

The first region may include a die mounting region that is isolated from the electrical lead, and the thermoset package body may include upper sidewalls that define an optical cavity above the die mounting region. The upper sidewalls may include oblique inner surfaces that define a reflector cup surrounding the die mounting region, and the package may further include an encapsulant in the reflector cup.

In some embodiments, at least a portion of the thermoset package body may extend through the leadframe.

The first region may include a reflector cup therein including oblique sidewalls extending from an upper corner of the reflector cup to a base of the reflector cup. A third thickness between the base of the reflector cup and the bottom surface of the first region is greater than the second thickness.

A width of the first region may be greater than a width of the base of the reflector cup. Furthermore, a width of the first region may be greater than or equal to a width of the reflector cup at the upper corner thereof.

The modular package may further include a submount on the base of the reflector cup, a solid state light emitting device on the submount, and a wirebond connection from the solid state light emitting device to the electrical lead.

The thermoset package body may include upper sidewalls that define an optical cavity above the reflector cup. In particular, the reflector cup may include a first reflector cup and the upper sidewalls may include oblique inner surfaces that define a second reflector cup surrounding the first reflector cup.

The thermoset package body may have a bottom surface that is substantially coplanar with the bottom surface of the first region.

The modular package may further include a plurality of electrical leads, and the first region may include a plurality of die mounting pads that are electrically connected to respective ones of the plurality of electrical leads and that are configured to receive a light emitting device.

Methods of forming a package for a solid state light emitting device according to some embodiments of the invention include providing a leadframe including a first region having a top surface, a bottom surface and a first thickness, a second region having a top surface, a bottom surface and a second thickness that is less than the first thickness, and an electrical lead extending laterally away from the second region. The leadframe is placed into a mold having a mold cavity, and a thermoset precursor material is dispensed into the mold cavity. Pressure is applied to the mold, and the thermoset precursor material is cured to form a thermoset package body on the leadframe.

The thermoset package body may expose the bottom surface of the first region, and the thermoset package body may be at least partially formed beneath a bottom surface of the electrical lead.

The first region may include a die mounting region, and the thermoset package body may include upper sidewalls that define an optical cavity above the die mounting region and that include oblique inner surfaces that define a reflector cup surrounding the die mounting region, the method may further include dispensing an encapsulant in the reflector cup.

The thermoset package body may further include a circumferential rim surrounding the first region, and positioning the lens above the reflector cup may include bringing the lens into contact with the circumferential rim.

The first region may include a reflector cup therein including oblique sidewalls extending from an upper corner of the reflector cup to a base of the reflector cup. A third thickness between the base of the reflector cup and the bottom surface of the first region may be greater than the second thickness. The methods may further include positioning a submount on the base of the reflector cup, positioning a solid state light emitting device on the submount, and forming a wirebond connection from the solid state light emitting device to the electrical lead.

Forming the thermoset package body may include forming the thermoset package body to expose a bottom surface of the first region of the leadframe.

In some embodiments, providing the leadframe may include providing a leadframe blank having a top surface, a first region having a bottom surface and having a first thickness between the top surface of the leadframe blank and the bottom surface of the first region, and a portion extending laterally away from the first region, the portion extending laterally away from the first region having a bottom surface and a second thickness less than the first thickness adjacent the first region from the top surface of the leadframe to the bottom surface of the portion extending away from the first region. A reflector cup is stamped into the first region.

Stamping the reflector cup into the first region may include bringing a stamp including a protrusion having a shape defining a desired shape of the reflector cup into contact with the upper surface of the leadframe blank above the first region, and applying sufficient energy to the stamp to impress an image of the protrusion into the first region of the leadframe blank.

The methods may further include trimming excess material squeezed out while stamping the reflector cup from the leadframe blank.

The reflector cup may include oblique sidewalls extending from an upper corner of the reflector cup to a base of the reflector cup, and a third thickness between the base of the reflector cup and the bottom surface of the first region may be greater than the second thickness.

In some embodiments, providing the leadframe may include providing a leadframe blank having a top surface and a bottom surface, and selectively etching, rolling and/or milling the leadframe blank to provide a first region having a bottom surface and having a first thickness between the top surface of the leadframe blank and the bottom surface of the region, and a second region having a bottom surface and a second thickness less than the first thickness from the top surface of the leadframe to the bottom surface of the second region. Selectively etching, rolling and/or milling the leadframe blank may include selectively etching, rolling and/or milling the leadframe blank to form a recess in the leadframe.

Some embodiments of the invention provide a modular package for a light emitting device. The package includes a leadframe including a first region having a top surface, a bottom surface and a first thickness and a second region having a top surface, a bottom surface and a second thickness that is less than the first thickness. The leadframe may further include an electrical lead extending laterally away from the second region and a leak barrier on a surface of the first region or a surface of the second region. A package body is on the leadframe and on the first region. The package body is on the top and bottom surfaces of the second region, and is also on the leak barrier.

The leak barrier may include a notch or groove in the leadframe, and the package body may be at least partially within the notch or groove. In some embodiments, the leak barrier may include a protrusion on the leadframe. The package body may be on the protrusion, such that the protrusion becomes molded inside the package body.

The package body may include a thermoset, such as a thermoset plastic.

The second region may include a recess in the leadframe, and the thermoset package body may at least partially fill the recess.

The first region may include a mounting region on the top surface thereof. The leak barrier may be on the top surface of the first region outside the mounting region, and the package body may be on the leak barrier.

The package body may include upper sidewalls that define an optical cavity above the mounting region, and the upper sidewalls may include oblique inner surfaces that define a reflector cup surrounding the mounting region. The package may further include an encapsulant in the reflector cup.

The leadframe may include a support lead, and the leak barrier may be on the support lead and/or on the electrical lead.

The first region may include a sidewall between the top surface and the bottom surface thereof. The leak barrier may be on the sidewall. In particular, the leak barrier may include a protrusion from the sidewall.

The package may further include a peripheral notch on a corner of the first region adjacent the bottom surface thereof. The package body may at least partially fill the peripheral notch and expose the bottom surface of the first region.

Methods of forming a package for a solid state light emitting device according to some embodiments of the invention include providing a leadframe including a first region having a top surface, a bottom surface and a first thickness and a second region having a top surface, a bottom surface and a second thickness that is less than the first thickness. The leadframe may further include an electrical lead extending laterally away from the second region and a leak barrier on a surface of the first region or the second region. The methods may further include placing the leadframe into a mold having a mold cavity, dispensing a precursor material into the mold cavity, applying pressure to the mold, and curing the precursor material to form a package body on the leadframe. The package body may be formed on the leak barrier.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1A:
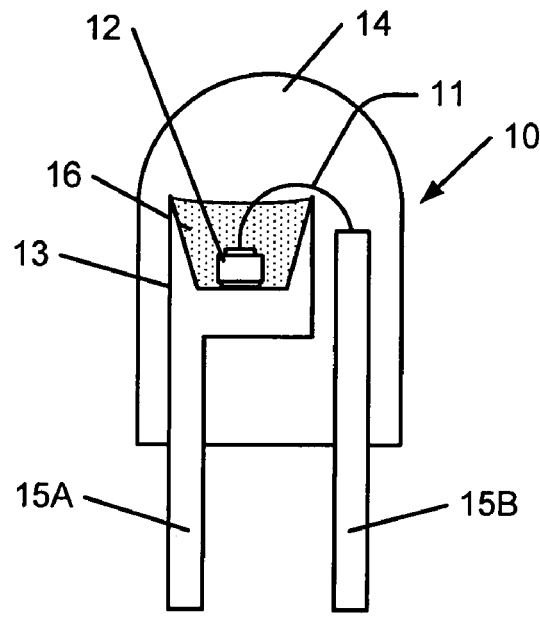
FIGS. 1A and 1B are cross-sectional side views illustrating conventional packages for light emitting devices.
Figure 1B:
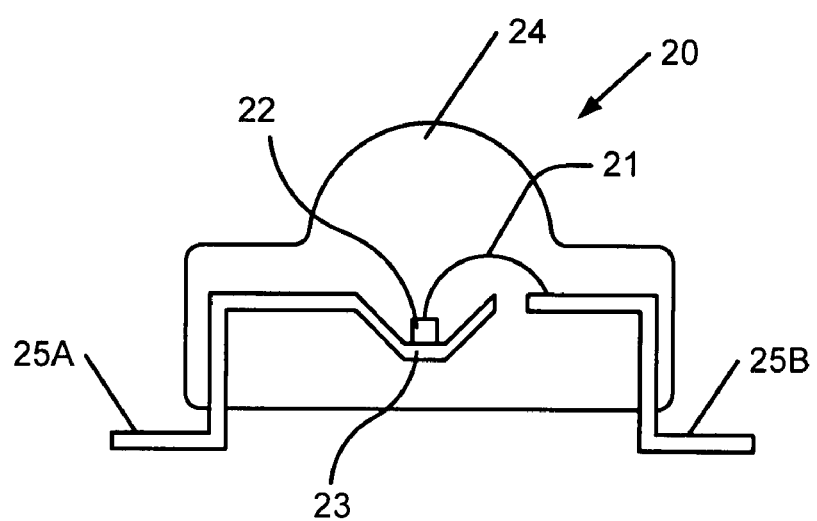

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

As used herein, the term semiconductor light emitting device may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers. In some embodiments, ultraviolet, blue and/or green light emitting diodes ("LEDs") may be provided. Red and/or amber LEDs may also be provided. The design and fabrication of semiconductor light emitting devices are well known to those having skill in the art and need not be described in detail herein.

For example, the semiconductor light emitting devices packaged in accordance with embodiments of the invention may be gallium nitride-based LEDs or lasers fabricated on a silicon carbide substrate such as those devices manufactured and sold by Cree, Inc. of Durham, N.C. The LEDs and/or lasers may be configured to operate such that light emission occurs through the substrate in a so-called "flip chip" orientation.

Figure 2A:
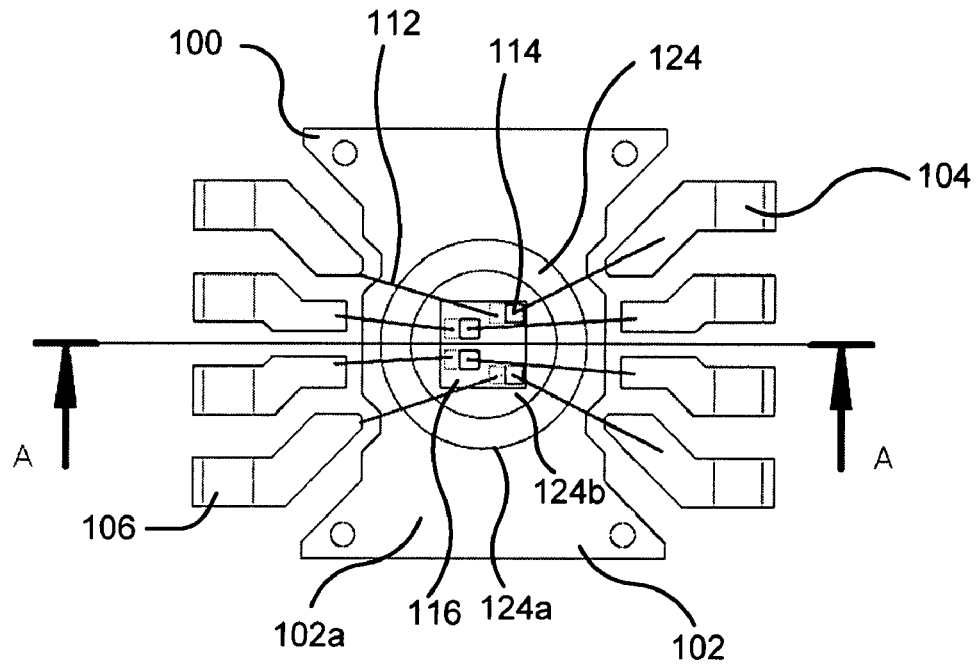
FIG. 2A is a top view and FIGS. 2B and 2C are a cross-sectional side views illustrating a leadframe for one or more light emitting devices according to some embodiments of the present invention.
Figure 2B:
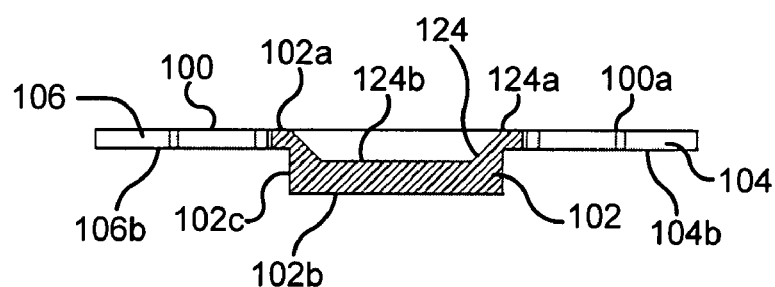
Figure 2C:
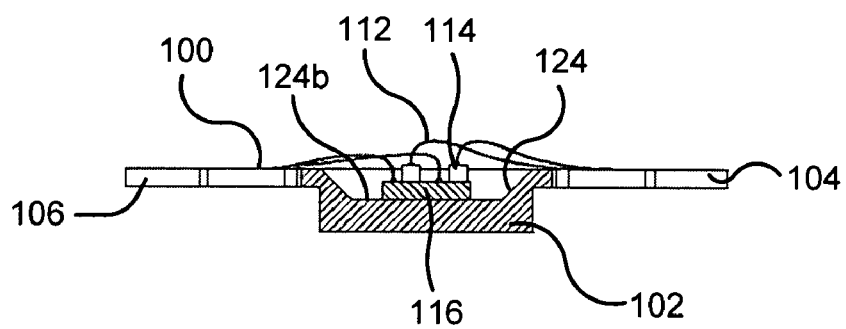

Referring now to FIGS. 2A-2C, a leadframe 100 according to some embodiments of the invention is illustrated. FIG. 2A is a top view of the leadframe 100, while FIGS. 2B and 2C are cross sections taken along line A-A of FIG. 2A. The leadframe 100 includes a central region 102 and a plurality of leads 104, 106 extending away from the central region 102. The electrical leads 104, 106 may be electrically isolated from one another and/or from the central region 102 of the leadframe 100. The leads may be arranged such that leads of opposite polarity type (e.g. anodes or cathodes) are provided on opposite sides of the leadframe 100, which may facilitate the connection of packages using the leadframes 100 in series.

As shown in FIG. 2A, the leadframe 100 further has an upper surface 100a. The central region 102 of the leadframe 100 has a substantially flat lower surface 102b that is spaced apart from lower surfaces 104b, 104c of the leads 104, 106 by sidewalls 102c. The central region 102 has a first thickness (i.e. the distance between the upper surface 100a of the leadframe 100 and the lower surface 102b of the central region 102), and the electrical leads 104, 106 have a second thickness (i.e. the distance between the upper surface 100a of the leadframe 100 and the lower surface 104b, 106b of the respective leads 104, 106) that is less than the first thickness.

A reflector cup 120 is formed in the central region 102. The reflector cup 124 includes an oblique sidewall that extends from the upper surface 100a of the leadframe 100 to a base 124b located within the central region 102. The reflector cup 124 may have an arbitrary peripheral shape. However, in the embodiments illustrated in FIGS. 2A-2C, the reflector cup 124 has a generally circular peripheral shape. Thus, the oblique sidewall of the reflector cup 124 may form a generally circular upper lip 124a where the reflector cup 124 intersects the upper surface 100a of the leadframe 100. The sidewall of the reflector cup 124 shown in FIGS. 2A-C has the shape of a conic section (e.g. a frustum). However, the sidewall of the reflector cup 124 may form other shapes, for example, a solid parabolic section.

The base 124b of the reflector cup 124 has a diameter that is less than a width of the central region 102 (i.e. a distance between the sidewalls 102c of the central region 102). Furthermore, the upper lip 124a of the reflector cup 124 has a diameter that may be less than or equal to the width of the central region 102. Moreover, the thickness of the central region 102 between the base 124b of the reflector cup 124 and the lower surface 102b of the central region 102 may be thicker than electrical leads 104, 106. As will be explained in greater detail below, a package for a solid state light emitting device may dissipate heat through the central region 102 of the leadframe 100, rather than through the leads 104, 106. Thus, the relative physical dimensions of the central region 102 may improve the heat dissipation properties of the package by reducing the thermal resistance of the package.

In general, thermal resistance is inversely proportional to the surface area through which heat is conducted. That is, in a simplified model, thermal resistance is defined by the equation $$R_{TH}=L/kA \qquad (1)$$

where k is the coefficient of thermal conductivity, L is the length of the material through which heat is to be dissipated, and A represents the area through which heat is to be dissipated.

In semiconductor packages, heat flows from a relatively small chip to a much larger area of a die-attach pad. Thus, thermal spreading and conduction may not be adequately modeled by a simple one-dimensional formula such as Equation (1). Rather, thermal resistance of a package device can be more accurately modeled using a thermal spreading resistance factor which takes into account the three-dimensional geometries of the chip and die-attach pad and their boundary conditions. According to this type of analysis, aside from the thermal conductivity of the die-attach pad, i.e. the heatspreader (such as the central region 102 in FIGS. 2C through 3B), the surface area around and underneath the chip and its thickness are the two most important parameters to give good thermal spreading before being conducted away through another interface, such as a solder joint between the heatspreader and an external heatsink—which may be a metal-core PCB (Printed Circuit Board) or a housing. Hence, in the design of a dual gauge leadframe, the central region 102 should be large and thick enough to achieve an efficient thermal spreading, which may result in good thermal performance for the entire package, in order to take better advantage of the relatively large surface area of the central region 102.

Through computer modeling, e.g. computer modeling based on Kennedy's thermal spreading resistance graphs, it has been found that a package having a low thermal resistance can be designed in a practical and cost-effective manner by having the bottom side of the semiconductor chip (which acts as a heat source) and solder pad (which acts as a heat sink) on two opposite sides of a copper substrate having a particular thickness. Thus, according to some embodiments of the invention, a dual gauge (thickness) copper alloy sheet may be provided. A thinner section of the sheet may be stamped into electrical leads, while the thicker portion of the sheet may be stamped to form a die attach pad on its front face and a solder pad on its back face. In particular embodiments of the invention, electrical current can be adequately conducted by thinner leads, while the heat energy may be effectively spread by the thicker section in which the die-attach pad is formed and that has a surface area that is a few times that of the chip footprint. In some embodiments, the thinner section may have a thickness of about 250 μm, while the thicker section may have a thickness of about 550 μm.

Referring to FIG. 2C, a submount 116 including a plurality of solid state light emitting devices 114 is mounted within the reflector cup 124 on the base 124b thereof. The submount 116 may include a nonconductive material such as aluminum nitride, silicon carbide and/or chemical vapor deposited (CVD) diamond on which a plurality of electrical traces (not shown) may be formed. The thermal conductivity of aluminum nitride and silicon carbide is about 200 W/MK, while the thermal conductivity of CVD diamond is about 800 W/MK. The thickness of the submount 116 may be from about 150 to about 400 μm, although other thicknesses may be used. A plurality of wirebond connections 112 are made between the submount 116 and the devices 114 on one hand and respective ones of the electrical leads 104, 106 on the other hand.

Figure 3A:
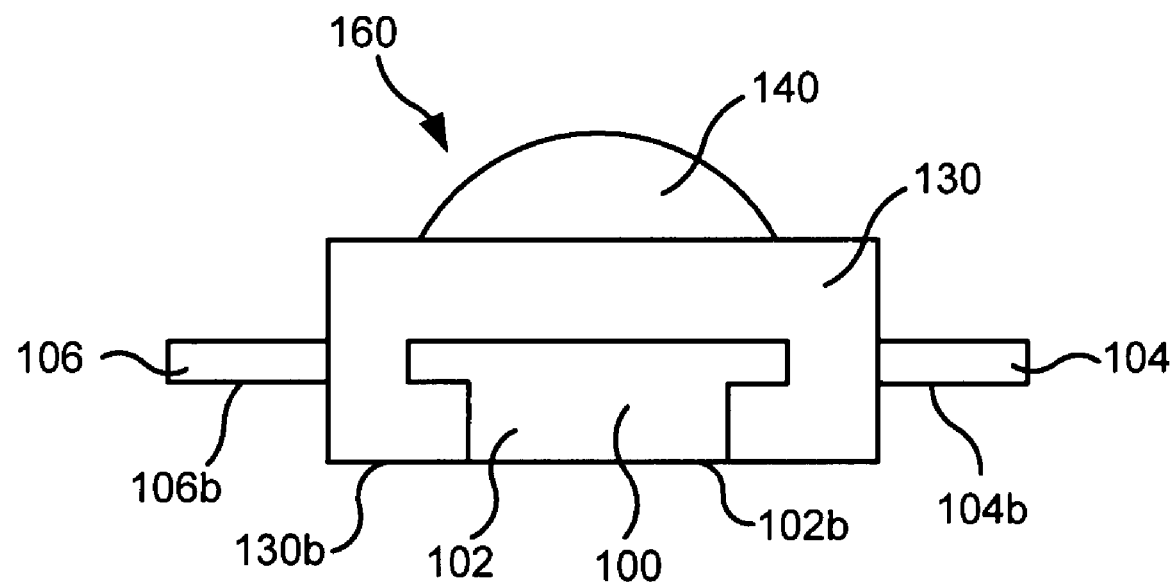
FIG. 3A is a side view and FIG. 3B is a cross sectional side view of a package for one or more light emitting devices according to some embodiments of the invention.
Figure 3B:
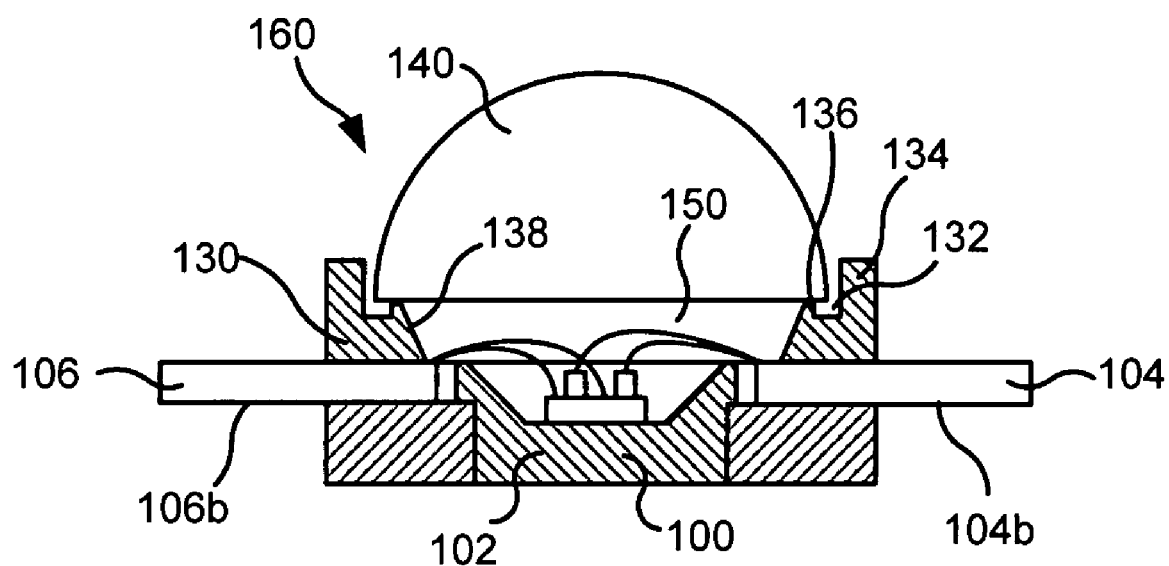

A package 160 including the leadframe 100 is illustrated in FIGS. 3A and 3B, which are side and cross sectional side views, respectively, of a package 160 for one or more light emitting devices. Referring to FIGS. 3A and 3B, the package 160 includes a molded package body 130 surrounding the leadframe 100 and a lens 140 mounted over the central region 102 of the leadframe 100. The electrical leads 104, 106 extend from sides of the package body 130. Other optical features, such as reflectors, diffusers, etc., may be provided instead of or in addition to the lens 140.

The package body 130 may be formed, for example, of thermoset and/or a thermoplastic by transfer or injection molding, around the leadframe 100. The thermoplastic may include a liquid crystal polymer such as a Vectra® series polymers A130 and/or S135 available from Ticona Engineering Polymers. Other suitable liquid crystal polymers are available from Solvay Advanced Polymers. Polycarbonate, Lexan® from GE Polymers and/or PPA (polyphthalamide) from Solvay Advanced Polymers may also be used as the thermoplastic for the package body 130. Embodiments including thermoset package bodies are described in more detail below. The package body 130 may expose the bottom surface 102b of the central region 102 of the leadframe 100. The package body 130 may extend at least partially between lower surfaces 104b, 106b of the leads 104, 106 and a lower surface 102b of the central region 102 of the leadframe 100 while exposing at least a portion of the lower surface 102b of the central region 102. Further, the package body 130 may have a bottom surface 130b that is coplanar with the bottom surface 102b of the central region 102 of the leadframe 100. However, in some embodiments, the bottom surface 102b of the central region 102 of the leadframe 100 and the bottom surface 130b of the package body 130 may not be coplanar. For example, the bottom surface 130b of the package body 130 may extend away from the bottom surface 102b of the central region 102 of the leadframe 100. In other embodiments, the central region 102 may extend away from the package body 130. When the package 160 is mounted, the exposed surface 100b of the leadframe 100 may be placed into thermal contact with, for example, an external heatsink (not shown).

As shown in FIG. 3B, the package body 130 may be formed to expose an upper surface of the central region 102 of the leadframe 100 including the reflector cup 120. The package body 130 may include opposing upper sidewalls 134 that define an optical cavity 150 above the reflector cup 120 and the submount 116. The upper sidewalls 134 may include oblique inner surfaces that define a second reflector cup 138 above and surrounding the first reflector cup 124. The lens 140 may be positioned at least partially within the optical cavity 150 above the reflector cup 120. The reflector cup 120 and the optical cavity 150 defined by the package body 130 may be filled, for example, with a liquid encapsulant material, such as liquid silicone and/or epoxy, which may include a wavelength conversion material, such as a phosphor, therein.

The lens 140 may be positioned in contact with a circumferential rim 136 that may be defined within the sidewalls 134 as shown in FIG. 3B and/or may be a separate feature of the body 130. The circumferential rim 136 may determine the vertical position of the lens 140 in relation to the solid state light emitting devices 114 in the reflector cup 120. Furthermore, the sidewalls 134 may include a circumferential moat 132 outside the circumferential rim 136. The circumferential moat 132 may be particularly useful when a liquid encapsulant such as silicone is used as an encapsulant for the package 160, as explained below.

In a process of assembling a package according to some embodiments of the invention, a liquid encapsulant is dispensed into the cavity 150 defined by the package body 130. The lens 140 is then lowered into the cavity 150, where it may contact the liquid encapsulant. When the liquid encapsulant is cured, it may act as a glue to hold the lens 140 in place in the package 160. When the lens 140 is placed in contact with the liquid encapsulant, some of the encapsulant may squeeze up around the lens 140, potentially interfering with the optical/mechanical properties of the package 160. In embodiments of the invention including a circumferential moat 132 surrounding a circumferential rim 136, the lens 140 is inserted into the cavity 150 until it contacts the circumferential rim 136. Thus, the height of the circumferential rim 136 may precisely determine the spacing between the lens 140 and the solid state light emitting devices 114, which may improve the optical uniformity from package to package. Excess liquid encapsulant material may flow preferentially into the circumferential moat 132 instead of flowing up and around the lens 140. The use of circumferential edges and moats for control of encapsulant materials and lens placement is described in detail in U.S. Pre-grant Publication No. 2005/0218421 entitled "Methods For Packaging A Light Emitting Device And Packaged Light Emitting Devices", which is assigned to the assignee of the present invention, the disclosure of which is incorporated herein by reference.

Figure 4A:
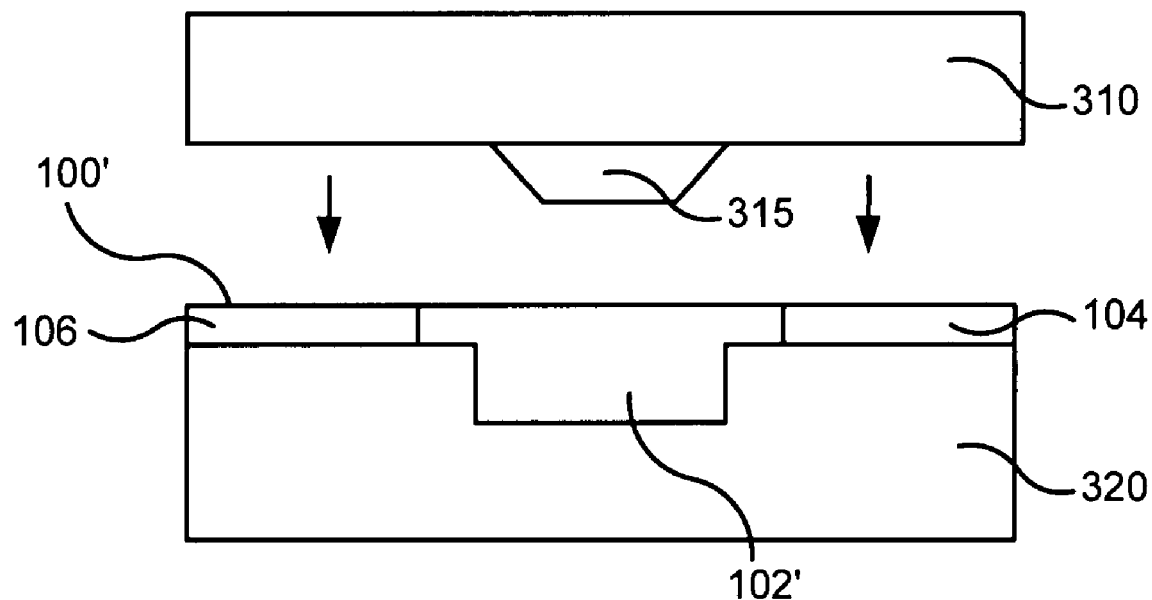
FIGS. 4A and 4B are schematic diagrams illustrating the formation of a lead frame according to some embodiments of the invention.
Figure 4B:
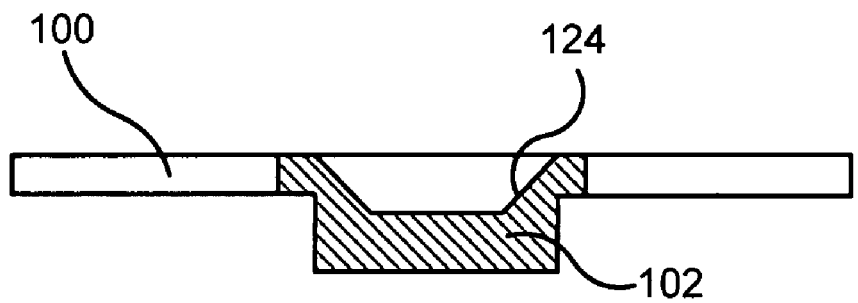

Formation of a leadframe 100 according to embodiments of the invention is illustrated in FIGS. 4A and 4B. As shown therein, a leadframe blank 100' includes a central region 102' and leads 104, 106 extending away from the central region 102'. The blank may be formed, for example, of copper, aluminum or another metal having high thermal conductivity. The central region 102' may have a thickness of about 550 µm, while the leads 104, 106 may have a thickness of about 250 µm. The central region 102' has a thickness that is greater than the thickness of the leads 104, 106. The blank 100' is placed in a support member 320 that is shaped to receive the blank 100'. A stamp 310 including a protrusion 315 is brought into contact with the blank 100', and sufficient energy (e.g. force and/or heat) is applied to impress an image of the protrusion 315 into the central region 102'. The protrusion 315 may have angled sidewalls and may have a width that is less than the width of the central region 102', so that the protrusion 315 creates a reflector cup 124 within the central region 102'. Excess material (not shown) that may be squeezed out when the reflector cup 124 is formed may be trimmed off of the completed leadframe 100.

Figure 5:
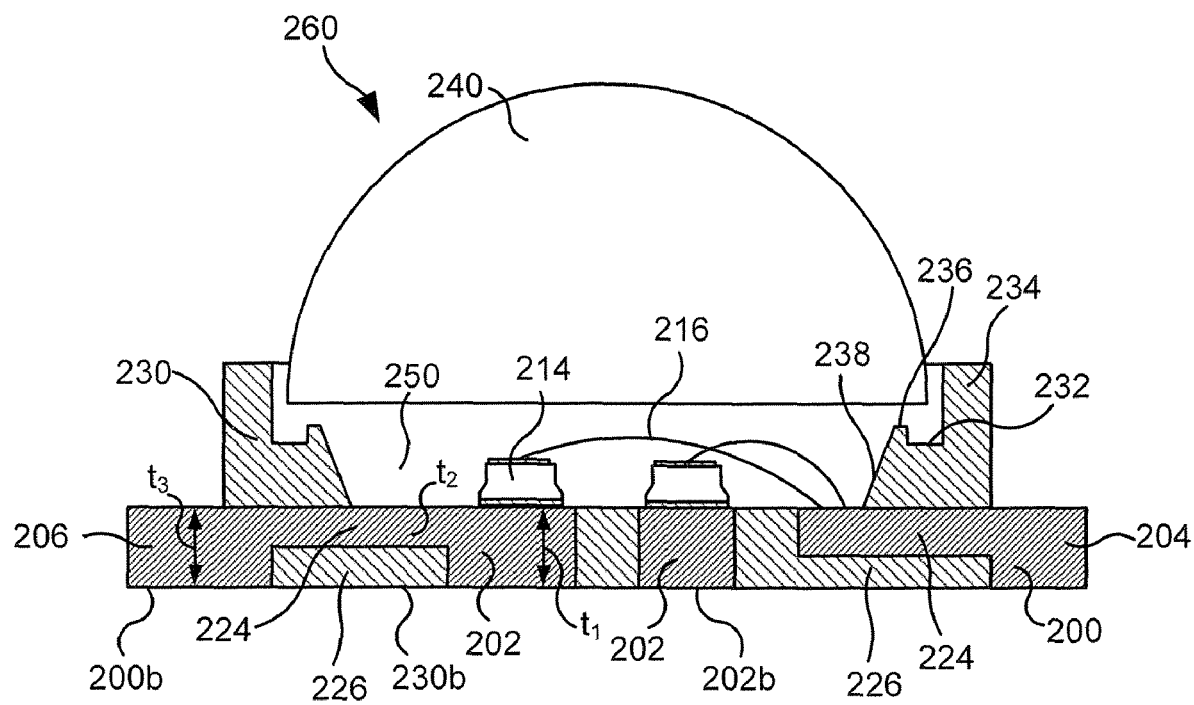
FIG. 5 is a cross sectional side view of a package for one or more light emitting devices according to further embodiments of the invention.

A solid state lighting package 260 according to further embodiments of the invention is illustrated in FIG. 5. The package 260 includes a leadframe 200 including a plurality of die mounting regions 202 (first regions having a thickness $t_1$) located in a central region of the leadframe 200 and a plurality of electrical leads 204, 206 having a thickness $t_3$ and extending away from the die mounting regions. Both the upper and lower surfaces of the die mounting regions 202 are exposed. In the embodiments illustrated in FIG. 5, respective ones of the first electrical leads 206 are formed integral with corresponding ones of the die mounting regions 202, while the second electrical leads 204 are electrically isolated from the die mounting regions 202.

Figure 6:
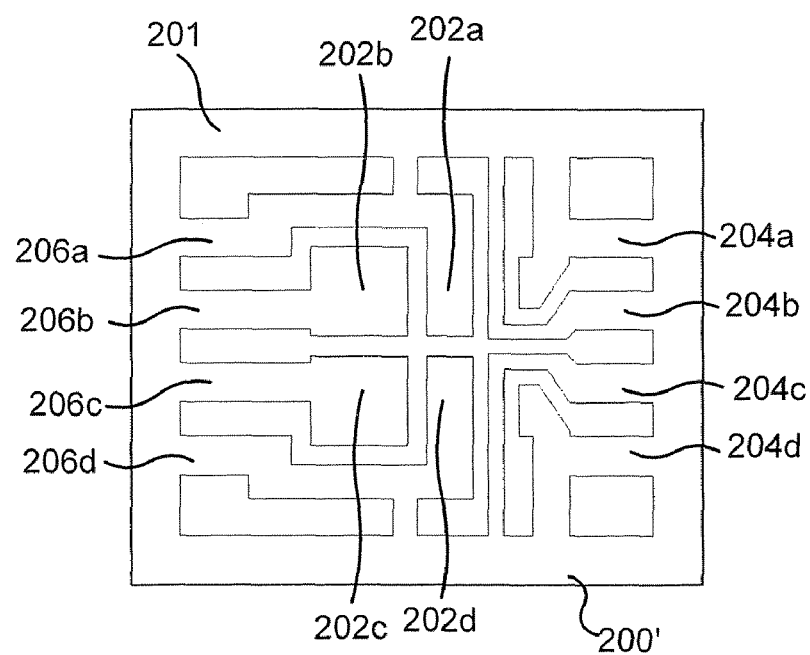
FIG. 6 is a top view of a leadframe configured for use in a package according to embodiments of the invention.

A leadframe blank 200' is shown in top view in FIG. 6. The leadframe blank 200' includes four die mounting regions 202a-d that are formed integral to four corresponding leads 206a-d. The blank 200' further includes four electrical leads 204a-d that are isolated from the die mounting regions 202a-d. The die mounting regions 202a-d and leads 204a-d and 206a-d are held in place by an external frame 201 that may be trimmed off after a package body is molded onto the leadframe blank 200'. The leadframe blank 200' may be made of a metal having a low thermal resistance such as copper, and may be less than about 30 mils thick. In some embodiments, the leadframe may be less than about 15 mils thick. As explained below, the leadframe 200 may be substantially thinner than a typical leadframe, since the leadframe 200 may be mounted directly onto an external heatsink, so that heat is extracted from the leadframe through a large surface area opposite the surface of the die mounting region 202a-d of the leadframe 200 on which the light emitting devices 214 are mounted.

Returning to FIG. 5, the leadframe 200 further includes second regions 224 of reduced thickness $t_2$ that define recesses 226 in the leadframe 200. The reduced thickness regions 224, 226 may be formed, for example, by selectively etching portions of the leadframe 200. A package body 230 is formed on/around the leadframe, for example by transfer or injection molding.

The package body 230 may expose the bottom surface 202b of the die mounting regions 202, as well as other portions of the bottom surface of the leadframe 200. Further, the package body 230 may have a bottom surface 230b that is coplanar with the bottom surface 200b of the leadframe 200. However, in some embodiments, the bottom surface 202b of the die mounting regions 202 of the leadframe 200 and the bottom surface 230b of the package body 230 may not be coplanar. For example, the bottom surface 230b of the package body 230 may extend beyond the bottom surface 202b of the die mounting regions 202 of the leadframe 200. In other embodiments, the die mounting regions 202 may extend beyond the package body 230. When the package 260 is mounted, the exposed surface 200b of the leadframe 200 may be placed into thermal contact with, for example, an external heatsink (not shown).

The package body 230 may further be formed to fill the recesses 226 defined by the reduced thickness regions 224 of the leadframe 200. Thus, the package body 230 may extend, at least partially, from a lower surface of the reduced thickness regions 224 to a lower surface 200b of the leadframe 200. By filling the recesses 226 with the package body 230, the package body 230 may form a strong mechanical connection to the leadframe 200 without the necessity of an adhesive. However, an adhesive agent may be added to the plastic used to form the package body 230 in order to prevent or reduce an outflow of liquid encapsulant material from the optical cavity 250 through seams or spaces between the plastic material of the package body and the leadframe 200.

The package body 230 may be formed to expose upper surfaces of the die mounting regions 202 of the leadframe 200. The package body 230 may include opposing upper sidewalls 234 that define an optical cavity 250 above the die mounting regions 202. The upper sidewalls 234 may include oblique inner surfaces 238 that define a reflector cup above and surrounding the die mounting regions 202. A lens 240 may be positioned at least partially within the optical cavity 250 above the die mounting regions 202. The optical cavity 250 defined by the package body 230 may be filled, for example, with a liquid encapsulant material, such as liquid silicone and/or epoxy, which may include a wavelength conversion material, such as a phosphor, therein.

The lens 240 may be positioned above a circumferential rim 236 that may be defined within the sidewalls 234 as shown in FIG. 5 and/or may be a separate feature of the body 230. In some embodiments, such as embodiments where the body 230 is formed of a thermoset, it may be desirable for the lens 240 not to directly contact the body 230. Furthermore, the sidewalls 234 may include a circumferential moat 232 outside the circumferential rim 236. As explained above, the circumferential moat 232 may be particularly useful when a liquid encapsulant such as silicone is used as an encapsulant for the package 260 to reduce or prevent squeeze-out of the encapsulant material during or after package assembly.

A plurality of solid state light emitting devices 214 are mounted on respective ones of the die mounting regions 202, which are electrically connected to respective ones of the first electrical leads 206. Wirebond connections 216 are made between the light emitting devices 214 and respective ones of the second electrical leads 204.

Figure 7:
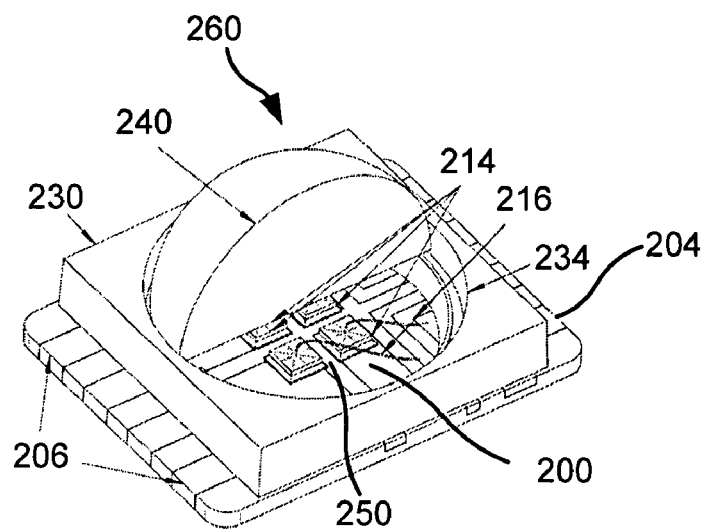
FIG. 7 is a cutaway view of a package for one or more light emitting devices according to embodiments of the invention.

FIG. 7 is a perspective cutaway view of a package 260 according to embodiments of the invention showing a package body 230 molded onto a leadframe 200. Four solid state light emitting devices 214 are mounted on the leadframe 200 within the optical cavity 250 defined by the sidewalls 234 of the package body 230. The solid state light emitting devices are connected by wirebonds 216 to respective ones of the second electrical leads 204, which extend from a side of the package opposite the first electrical leads 206. A lens 240 is positioned above the optical cavity 250.

Figure 8:
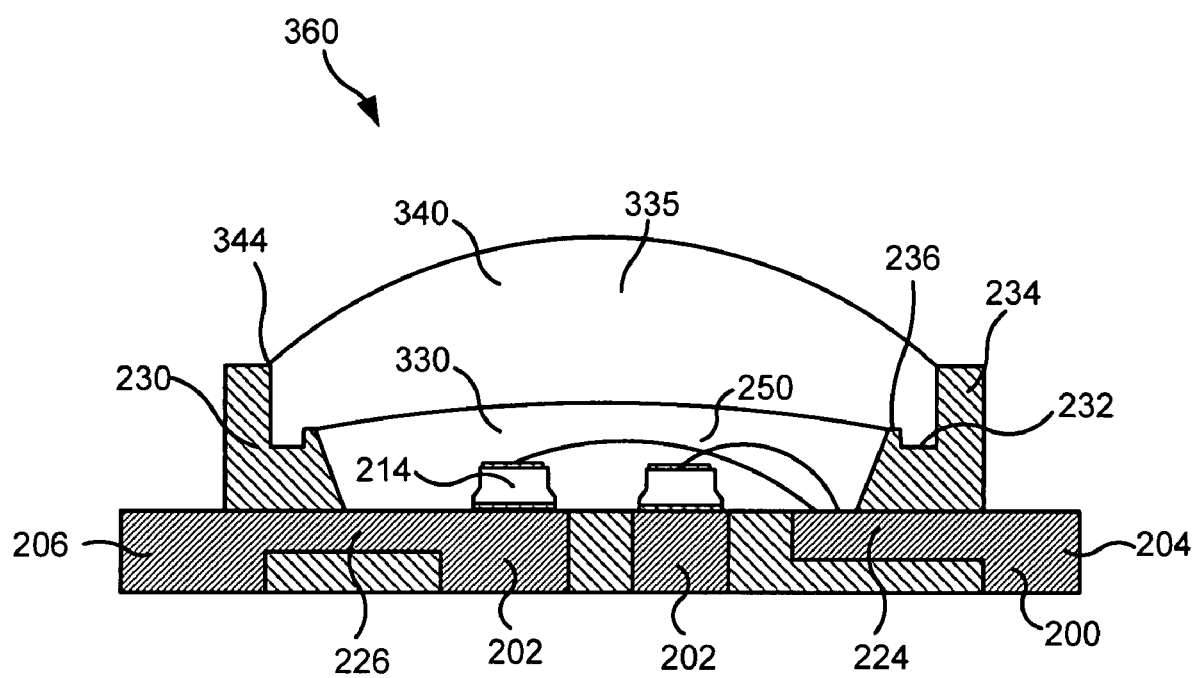
FIG. 8 is a cross sectional side view of a package for one or more light emitting devices according to still further embodiments of the invention.

FIG. 8 is a cross sectional view of a package 360 for solid state light emitting devices according to further embodiments of the invention. Features of the package 360 having the same reference numbers as those shown in FIG. 5 are similar to the corresponding features of the package 260 shown in FIG. 5. In the package 360, instead of providing a separate lens element that is inserted into the package, a lens 340 is formed by dispensing a liquid encapsulant material into the cavity formed by the sidewalls 230 and curing the liquid encapsulant. Dispensed lenses are discussed in U.S. patent application Ser. No. 11/197,096 entitled "Packages for Semiconductor Light Emitting Devices Utilizing Dispensed Encapsulants and Methods of Packaging the Same" filed Aug. 4, 2005, which is assigned to the assignee of the present invention, and the disclosure of which is incorporated herein by reference.

In particular, after the light emitting devices 214 have been mounted on the die attach regions 202, a first dispense of encapsulant material 330 may be performed to cover the devices 214. The material of the first dispense may include a wavelength conversion material such as a phosphor. The first encapsulant material 330 may form a convex, flat, or concave meniscus defined by the circumferential rim 236 of the sidewall portions 234, which may be provided with sharp edge to facilitate the formation of the meniscus. After the encapsulant material 330 has been at least partially cured, a second dispense of encapsulant material 335 may be performed. The second encapsulant material 335 may be formed to have a concave, flat, or convex meniscus defined by an upper edge 344 of the sidewall portions 234 depending on the amount of material dispensed. The second encapsulant material 335 may then be cured to form a lens 340 above the optical cavity 250.

Embodiments of the invention may permit the formation of packages for solid state light emitting devices in which multiple high-power devices are arranged in close proximity, which results in a higher optical quality emission with better color mixing. Furthermore, assembly of a package according to embodiments of the invention may be simplified, since the package body may be formed through injection molding techniques.

According to some embodiments of the invention, a leadframe-based package for one or more solid state light emitting devices may provide a short thermal path between the solid state light emitting devices and an external heatsink, since the light emitting devices are mounted on one side of the heatsink, while the opposite side of the leadframe is used to contact an external heatsink. Furthermore, the surface area of the leadframe through which heat is extracted may be larger than the die mounting area, which may improve heat extraction.

As described above, the use of injection-molded thermal plastics to form a body on a leadframe may offer a low-cost solution for LED packages for general-purpose device packages. However injection molded plastics may not be suitable for all purposes. For example, injection molded plastics may not be suitable for packages requiring more robust thermal performance and/or more environmental protection to the semiconductor chips packaged inside.

Accordingly, some embodiments of the invention provide a high power semiconductor package including a more robust, high thermal-performance composite substrate that includes a body formed of a thermoset on a dual-gauge metal leadframe. The use of a thermoset with a dual-gauge lead frame may provide particular advantages, since a thermoset may be able to fill corners and/or recesses in the leadframe where the thickness of the leadframe changes, and that may otherwise provide an undesired pathway for liquids and/or gases to pass into/out of the package. A package body formed using a thermoset may form a strong mechanical connection to the leadframe due in part to the dual gauge nature of the leadframe and may also form a tight seal on the leadframe that may reduce and/or prevent the flow of liquids/gases into and/or out of the package notwithstanding the dual-gauge nature of the leadframe. Thus, a package including a thermoset body on a dual gauge leadframe may be mechanically stable and/or may have a high degree of hermeticity. The thermoset may include a thermosettable polymer, copolymer, oligomer, and/or elastomer (or plastic), or mixtures thereof.

Accordingly, a package according to some embodiments of the invention may provide a multiple chip, high performance hybrid LED package that is compatible with high solder reflow eutectic die-attach processes. Further embodiments of the invention provide a robust, high thermal device package that can withstand severe environmental operating conditions at high operating power without undue distortion, body damage, leakage and/or failure.

A thermoset that may be used according to some embodiments of the invention may include an epoxy, polyimide, a phenolic resin and/or any other thermosettable material. A thermoset for use in some embodiments of the invention can be transfer molded onto a leadframe, such as a stamped or etched dual-gauge leadframe. Other types of molding may be used to form a body on a leadframe, such as injection molding and/or casting.

When the thermoset is chemically cross-linked (i.e., cured), it will chemically bond to the leadframe to form a robust 3-dimensional solid thermoset body. The body/leadframe combination may be formed to include one or more functional features, such as metal die bond pads, a heatsink and electrical leads, plastic cavity, lens retention features, etc., as described above in connection with FIG. 5, for example.

Although, as described above, a thermal plastic such as LCP (liquid crystal polymer) may be used to form a molded body, a thermoset body may offer enhanced structural and/or environmental protection to the device(s) mounted in the package.

In particular, the use of a thermoset in combination with a dual-gauge leadframe as described above may be capable of unexpectedly improved performance. As noted above, a dual-gauge leadframe, such as the leadframe 100 shown in FIGS. 3A and 3B and/or the leadframe 200 shown in FIG. 5, may be made, for example, by milling, stamping, and/or or rolling a metal strip to form a leadframe having areas of different cross-sectional thickness. Different functional areas of the leadframe, such as leads, heatsinks, die attach pads, etc., can then be made and/or stamped at different sections of the leadframe to provide desired functionality and/or performance.

Thermoset materials, such as thermosetting plastics are polymer materials that may be dispensed in precursor form, such as a resin, and then cured to a stronger form through the addition of energy, such as heat (generally near 200° C.) or irradiation. The curing process transforms the resin into a solid plastic by a cross-linking process in which the molecular chains of the material react at chemically active sites and link into a rigid, three-dimensional structure. The cross-linking process forms a molecule with a larger molecular weight, resulting in a material with a higher melting point or that simply changes to carbon and residue without melting. Thus, a thermoset material may not be melted and re-shaped after it is cured. As a result of the formation of a three-dimensional network of bonds during the cross-linking phase, thermoset materials are generally stronger than thermoplastic materials. Thus, thermoset materials may be better suited for high-temperature applications than thermoplastic materials.

Most thermosets, such as epoxy and/or polyimide, will bond to organic and/or inorganic surfaces when they come into contact with the surface during the cross-linking (curing) phase. This bond at the surface may be very strong and/or may be impervious to fluids or gases, such that a soft-gel encapsulant surrounding the semiconductor device(s) mounted in the package may not leak out. Furthermore, the bond between the thermoset and the leadframe may reduce or prevent the entry of moisture into the package, which could otherwise cause device failure.

In contrast, in a package including a thermoplastic molded body, there may be no bonding between the plastic body and the leadframe on which it is molded. As such, fluids and/or gases can pass in both directions through the interface between the thermoplastic and the leadframe. Accordingly, an advantage of using thermosets such as epoxy or phenolic resin may be found in the bonding and sealing properties of thermosets at the interface with an organic and/or inorganic surface on which it is molded. This bonding may reduce and/or prevent moisture and/or other fluids or gases from passing through the interface. Thus, a thermoset may provide a higher degree of hermeticity at the interface than a thermal plastic can offer.

Many thermosets can withstand temperatures in excess of 350° C. without becoming deformed or distorted. In general, thermosets may be able to withstand higher temperatures than conventional thermoplastic materials, such as PPA (e.g., Amodel®) and/or LCP (e.g., Vectra®), each of which can only withstand temperatures up to about 280° C. Accordingly, most thermal plastic materials cannot withstand the high solder reflow temperatures typically used for surface mount technology, which may be used to mount some LED packages.

Thermosets, such as many epoxies, can be molded by transfer molding, compression molding and/or casting processes to create plastic bodies having very fine details and/or intricate designs. During the molding/casting process, a thermoset may typically first transform into a flowable state before it is cured into a solid state. During this fluid state, high pressure can be applied to the material to allow the fluidic resin to fill even very small crevices in a mold. A thermal plastic may not be able to fill spaces as small as a thermoset can, because the injection mold for a thermal plastic is typically set at a temperature below the melting temperature of the thermal plastic, which may start to cool the thermal plastic to a solid state as soon as it enters the mold cavity.

Accordingly, the use of a thermoset with a dual-gauge lead frame may provide particular advantages, since a thermoset may be able to fill corners and/or recesses in the leadframe where the thickness of the leadframe changes. As noted above in connection with FIG. 5, by filling recesses in the leadframe, such as the recesses 226, with the package body 230, the package body 230 may form a strong mechanical connection to the leadframe 200 without the necessity of an adhesive. By using a thermoset, the package body may form a strong mechanical connection to the leadframe and may also form a tight seal on the leadframe that may reduce and/or prevent the flow of liquids/gases into and/or out of the package. Thus, as noted above, a package including a thermoset body on a dual gauge leadframe may be mechanically stable and/or may have a high degree of hermeticity.

Although the cost of forming a leadframe body using a transfer molded thermoset may be more expensive than using thermal plastic, the overall increase in packaging cost may be negligible. Furthermore, in applications desiring higher thermal performance, package quality and/or reliability, the use of thermosets may be economically justified.

Figure 9:
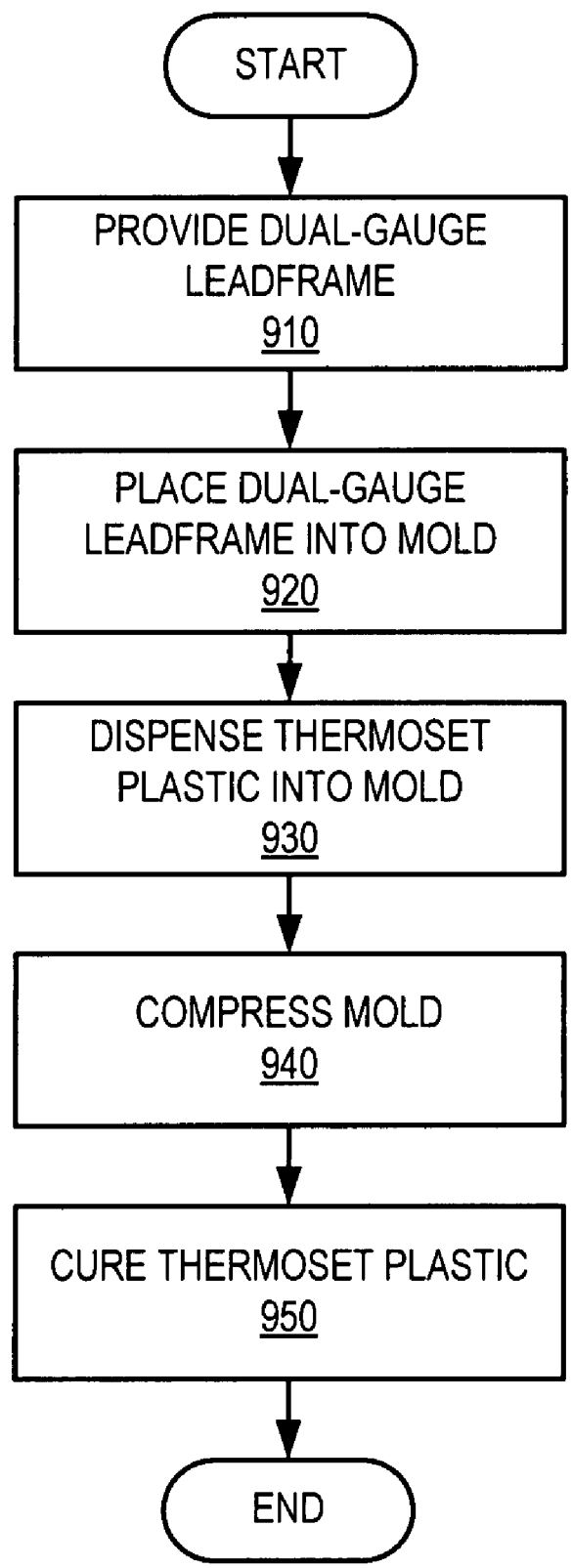
FIG. 9 is a flowchart illustrating operations according to some embodiments of the invention.

FIG. 9 is a flowchart illustrating operations 900 according to some embodiments of the invention. As shown therein, a dual-gauge leadframe is provided (Block 910). The dual-gauge leadframe may be formed, for example, by milling, etching, rolling, and/or stamping a metal blank, as described above, so that the leadframe has recessed portions and/or thicker portions therein.

The dual-gauge leadframe is then placed into a mold cavity (Block 920) that has the shape of a plastic body to be molded onto the leadframe.

Examples of thermoset materials are epoxy resins and phenol-novolac resins from Nitto Denko. Such materials may be loaded with filler particles, such as spherical fused silica and/or irregularly-shaped $TiO_2$ (titanium dioxide) solid particles, and/or carbon fibers at predetermined percentage by weight in order to obtain desired physical properties, such as coefficient of thermal expansion (CTE), flexural modulus, optical surface reflectance, heat deflection temperature (HDT), etc.

The thermoset resin, in solid or liquid form, is then loaded or dispensed into the mold cavity (Block 930), which is set at a high temperature (typically at about 175° C.). Pressure (hundreds of psia) is applied to the thermoset resin to push the resin into the runner system of the mold. At this time, the solid resin will melt into a solution of very low viscosity. The liquid resin may then flow easily through the mold runners into the mold cavities, filling small crevices and corners and recesses of the dual-gauge leadframe (Block 940). The pressure on the mold is increased to about 1,000 psia to pack the resin into the smallest gaps in the mold.

Inside the mold cavities, the liquid thermoset is continuously subjected to the high mold temperature of about 175° C. or more and a high material pressure of about 1,000 psia. Under these conditions, the liquid thermoset will solidify/cure in about 3-5 minutes (Block 950). As noted above, when a thermoset cures, a cross-linking process occurs in which its constituent monomers or polymers chemically react with one another to form large, three-dimensional molecules that give solid thermoset material rigidity and a high melting point. The cross-linking action also causes the thermoset to chemically adhere or bond to the dual-gauge leadframe, imparting high mechanical stability to the resulting body/leadframe structure as well as providing a tight seal to the leadframe. This phenomenon of bonding may be desirable for a package for a semiconductor light emitting diode, in that an encapsulant can then be contained and retained inside without leaking out from the package.

Since the thermoset resin bonds readily to surfaces, the mold cavity may be made of hardened mold steel and polished to a mirror finish to reduce the tendency of the hardened thermoset to bond to the mold cavity. In addition, strong ejectors may be used to eject the molded parts from the mold cavity.

FIGS. 10-13 illustrate LED packages that may be particularly suitable for use with a thermoset or thermal-plastic material, and that may have reduced leakage of liquid or soft gel encapsulant from the package, which may increase the reliability of the package. For example, FIGS. 10A, 10B and 10C are front and back isometric projections and a top view, respectively, of a dual-gauge leadframe 400 that may be particularly suitable for use with a package body, such as the package body 420 shown in isometric projection in FIGS. 11A and 11B.

Figure 10A:
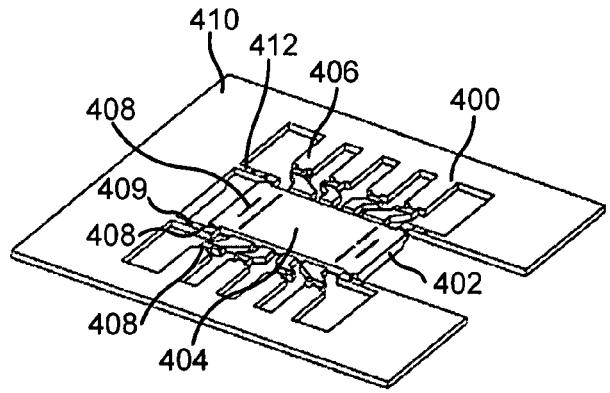
FIGS. 10A-10C are front and back isometric projections and a top view, respectively, of a dual-gauge leadframe according to some embodiments of the invention.
Figure 10B:
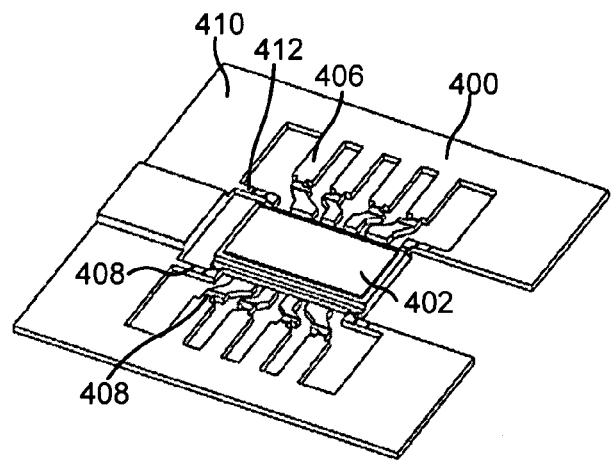
Figure 10C:
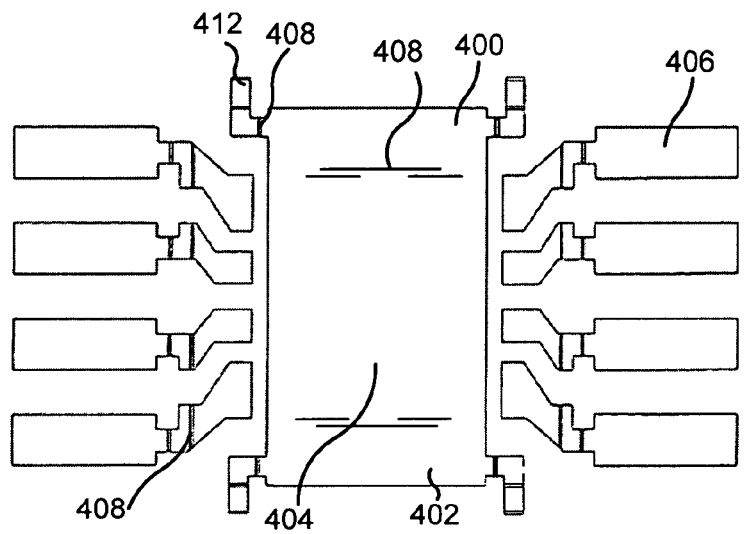
Figure 12:
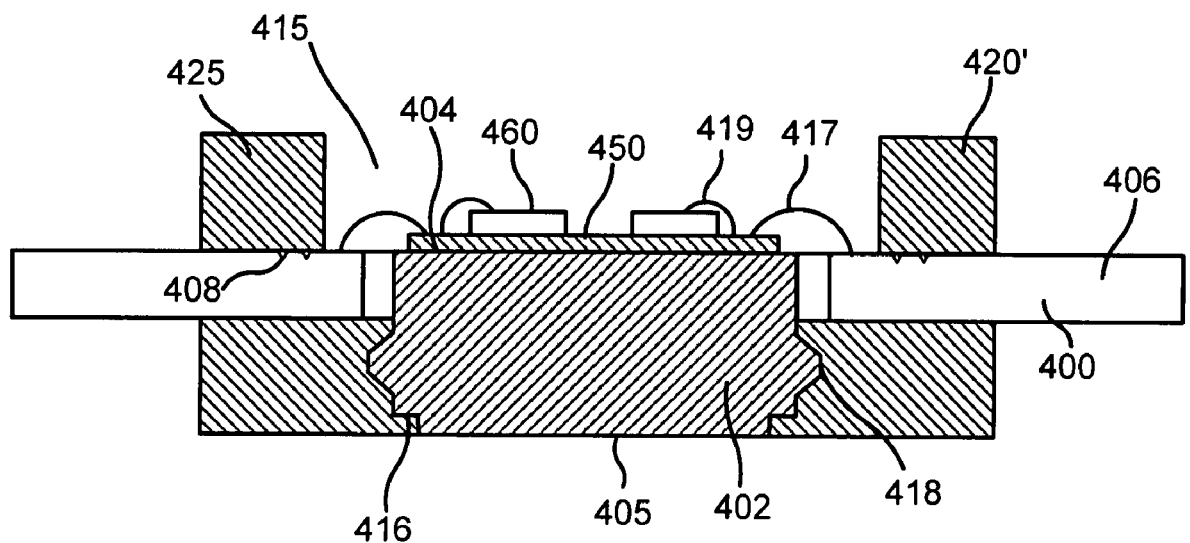
FIG. 12 is a cross-sectional illustration of a leadframe/body assembly according to some embodiments of the invention.

In particular, referring to FIGS. 10A to 10C, the leadframe 400 includes a thicker central portion 402 which functions as a heatsink as well as providing a mounting surface 404 on which a submount, such as the submount 450 shown in FIG. 12, may be mounted. A plurality of relatively thinner leads 406 extend towards the central portion 402. In particular, the central portion of the leadframe 400 may have a thickness of about 0.5 mm, while the leads 406 may have a thickness of about 0.25 mm. In some embodiments, the central portion of the leadframe 400 may have a thickness of about 0.55 mm. The leadframe 400 may include, for example, copper and/or a copper alloy having a high thermal conductivity of about 370-400 W/m° K.

Prior to formation of the package body, the central portion 402 and the leads 406 are held in place by a support frame 410. The leads 406 may be attached directly to the support frame 410, while the central portion 402 may be attached to the support frame 401 by one or more support leads 412. Once the package body is formed on the leadframe 400, the leads 406 and the central portion 402 may be detached from the support frame 410.

The leadframe 400 includes additional features that may help to improve the integrity of the final package. For example, a plurality of leak barriers 408 may be formed on/in the mounting surface 404 of the central region 402 of the leadframe 400. The leak barriers 408 may include features such as notches and/or grooves that may be etched and/or stamped into the leadframe 400. When the package body is formed on the leadframe, the material of the package body may flow into the leak barriers 408 and solidify on or within the leak barriers 408 when cured. The leak barriers 408 may provide a three-dimensional surface for bonding the package body to the leadframe 400. In addition, the leak barriers 408 may provide a longer path through which a potential leak would have to travel, thus potentially reducing the likelihood of a substantial leak into or out of the optical cavity of the package. (Leaks may tend to occur, for example, when soft-gel encapsulant material in an LED package expands or contracts due to heating or cooling.)

The leak barriers 408 may also be formed on the leads 406 as well as on the support leads 412, as further illustrated in FIGS. 10A to 10C.

The support leads 412 may further include breakage features 409, which may include deeper notches and/or grooves in the support leads 412, at which the support leads may be easily broken or sheared to separate the central portion 402 from the support frame 410. In some embodiments, the breakage features 409 may be positioned such that they are within the periphery of the package body, so that when the support leads 412 are broken off, no part of the support leads 412 extends outside the periphery of the package body.

Figure 11A:
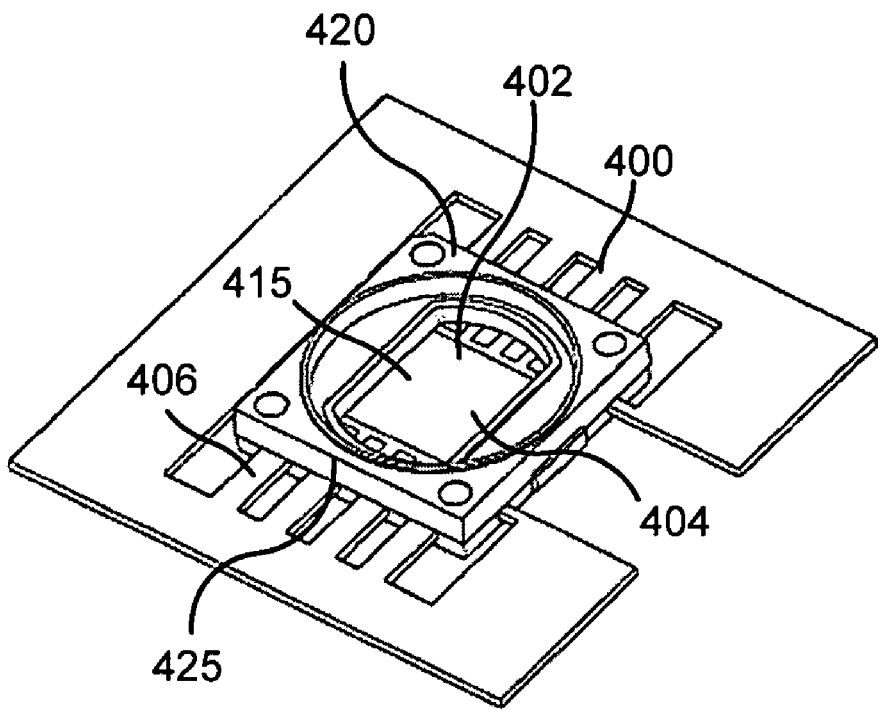
FIGS. 11A-B are front and back isometric projections of a leadframe/body assembly according to some embodiments of the invention.
Figure 11B:
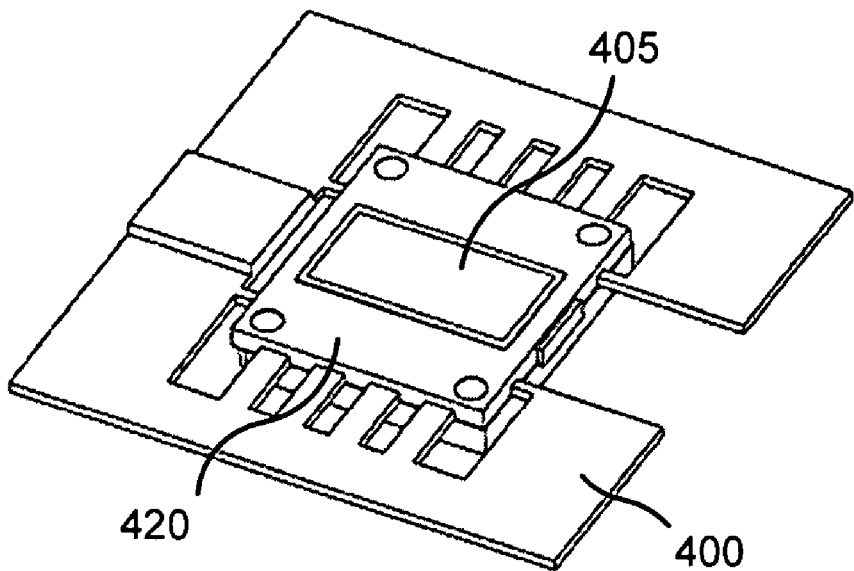

Referring to FIGS. 11A and 11B, a package body 420 may be formed on the leadframe 400. In particular, the package body 420 may be formed to expose at least a portion of the mounting surface 404 of the central portion 402 of the leadframe 400.

The package body 420 may include, for example, a thermoset, such as a thermoset plastic. In order to discourage leakage, it may be desirable to encapsulate as much of the leadframe 400 with thermoset as possible, leaving only adequate surface areas exposed for die attach, wirebonding and heat sink. The package body 420 may further include sidewalls 425 that define an optical cavity 415 above the mounting surface 404. Further, at least a portion of each of the leads 406 is exposed within the cavity 415. A bottom surface 405 of the central portion 402 opposite the mounting surface 404 is also exposed by the package body 420. The bottom surface 405 may provide heat dissipation for the package. Thus, it may be desirable for as much of the bottom surface 405 to be exposed as possible.

FIG. 12 is a schematic cross section of a package body 420' formed on a leadframe 400 according to embodiments of the invention. Some dimensions and/or features of the package body 420' and the leadframe 400 have been exaggerated for purposes of illustration. As shown in FIG. 12, a submount 450 is mounted on the mounting surface 404 of the central portion of the leadframe 400. A plurality of LED chips 460 are mounted on electrical traces (not shown) on the submount 450. The submount 450 may include, for example, an electrically insulating, thermally conductive material, such as aluminum nitride.

The LED chips are connected via wirebonds 419 to electrical bondpads (not shown) on the submount 450, which are in turn connected to the leads 406 via wirebonds 417. Accordingly, the submount/LED chip assemblies may be pre-assembled and mounted as a modular unit onto the leadframe 400.

The package body 420' includes sidewalls 425 extending above the leadframe 400 and defining an optical cavity 415 above the LED chips 460. At least a portion of the sidewalls 425 are formed on surfaces of the leads 406 and the central portion 402 including the leak barriers 408, so that the package body 420' forms a strong mechanical connection to the leadframe as well as a connection that may reduce or inhibit leakage into/out of the optical cavity 415, as described above.

In addition, the central portion 402 of the leadframe 400 may include other features that may enhance the mechanical stability and/or leak resistance of the final package. For example, the central portion 402 of the leadframe 400 may include etched and/or stamped features on sidewalls of the central portion 402 between the mounting surface 404 and the bottom surface 405 thereof, such as protrusions 418. As with the leak barriers 408, the protrusions 418 may reduce or discourage leaks by increasing the potential path length for any leak into/out of the optical cavity 415. The protrusions 418 may further improve the mechanical connection between the package body 420' and the leadframe 400.

Further, a peripheral notch 416 may be formed in the bottom corner of the central portion 402 of the leadframe 400 adjacent the bottom surface 405 thereof. The peripheral notch 416 may be formed, for example, by stamping. In addition, the act of stamping the peripheral notch 416 into the central portion 402 of the leadframe 400 may have the collateral effect of producing a beneficial protrusion 418 in the sidewall of the central portion 402 of the leadframe 400.

Figure 13:
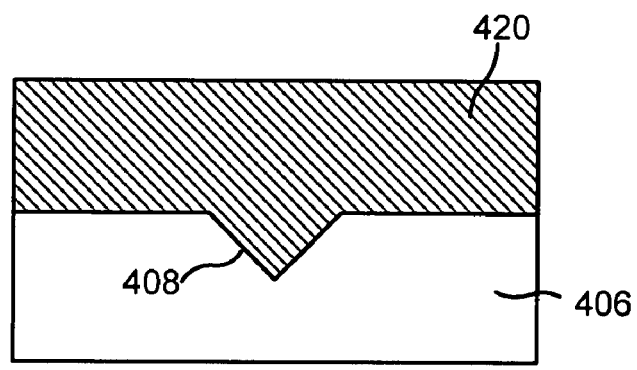
FIG. 13 is a detail cross-sectional illustration of an interface between a leadframe and a package body according to some embodiments of the invention.

A leak barrier 408 is shown in more detail in FIG. 13, which is a partial cross section of a portion of a leadframe/body assembly. As shown therein, the leak barrier 408 may include a notch stamped into a lead 406 of the leadframe 400. The body 420 at least partially extends into the leak barrier 408. As noted above, thermosets can be used to fill very small spaces. Thus, it may be particularly beneficial to use a thermoset material to form the package body in embodiments including leak barriers 408, as a thermoset may effectively fill and bond to small notches used as leak barriers.

In order to further increase the resistance of the final package to leakage, the package body 420, 420' may be formed of a thermoset having a coefficient of thermal expansion that is substantially matched to the coefficient of thermal expansion of the leadframe 400. For example, some thermoset plastics have coefficients of thermal expansion of about 17.7 ppm/° C., while copper, which may be used to form the leadframe 400, may have a coefficient of thermal expansion of about 18 ppm/° C.

The foregoing description is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A modular package for a light emitting device, comprising:
  a leadframe including a central body including a first region having a top surface, a bottom surface and a first thickness and a second region having a top surface, a bottom surface and a second thickness that is less than the first thickness, the leadframe further including a plurality of electrical leads extending laterally away from the second region, wherein the plurality of electrical leads are electrically isolated from the second region; and
  a thermoset package body on the leadframe and surrounding the first region, wherein thermoset package body is on the top and bottom surfaces of the second region and extends between the second region and the plurality of electrical leads, and wherein the thermoset package body forms a hermetic bond to the leadframe.

2. The modular package of claim 1, wherein at least a portion of the thermoset package body extends through the leadframe.

3. The modular package of claim 1, wherein the first region includes a reflector cup therein, the reflector cup including oblique sidewalls extending from an upper corner of the reflector cup to a base of the reflector cup;
  wherein a third thickness between the base of the reflector cup and the bottom surface of the first region is greater than the second thickness.

4. The modular package of claim 3, wherein a width of the first region is greater than a width of the base of the reflector cup.

5. The modular package of claim 3, wherein a width of the first region is greater than or equal to a width of the reflector cup at the upper corner thereof.

6. The modular package of claim 3, further comprising a submount on the base of the reflector cup, a solid state light emitting device on the submount, and a wirebond connection from the solid state light emitting device to the electrical lead.

7. The modular package of claim 3, wherein the thermoset package body includes upper sidewalls that define an optical cavity above the reflector cup.

8. The modular package of claim 7, wherein the reflector cup comprises a first reflector cup and wherein the upper sidewalls include oblique inner surfaces that define a second reflector cup surrounding the first reflector cup.

9. The modular package of claim 1, wherein the thermoset package body has a bottom surface that is substantially coplanar with the bottom surface of the first region.

10. The modular package of claim 1, further comprising a plurality of electrical leads, wherein the first region comprises a plurality of die mounting regions that are electrically connected to respective ones of the plurality of electrical leads and that are configured to receive a light emitting device.

11. The modular package of claim 1, wherein the thermoset package body comprises a thermoset plastic.

12. The modular package of claim 1, wherein at least one of the electrical leads extends through the thermoset package body and into the optical cavity.

13. The modular package of claim 12, wherein a portion of the thermoset package body beneath the optical cavity extends between the at least one electrical lead and the central body of the leadframe to isolate the at least one electrical lead from the central body of the leadframe.

14. The modular package of claim 13, wherein the encapsulant in the reflector cup comprises silicone.

15. The modular package of claim 1, wherein the first region comprises a mounting region, and wherein the plurality of electrical leads are isolated from the mounting region, and wherein the thermoset package body includes upper sidewalls that define an optical cavity above the mounting region.

16. The modular package of claim 15, wherein the upper sidewalls define a reflector cup surrounding the mounting region, the package further comprising an encapsulant in the reflector cup.

\* \* \* \* \*